(12) United States Patent
Sakala et al.

(10) Patent No.: US 11,242,150 B2
(45) Date of Patent: Feb. 8, 2022

(54) ANTI-ICING SYSTEM FOR AN AIRCRAFT

(71) Applicant: GENERAL ELECTRIC COMPANY, Schenectady, NY (US)

(72) Inventors: Viswanadha Gupta Sakala, Bangalore (IN); Ravindra Shankar Ganiger, Bangalore (IN); Nicholas Joseph Kray, Mason, OH (US)

(73) Assignee: General Electric Company, Schenectady, NY (US)

( * ) Notice: Subject to any disclaimer, the term of this patent is extended or adjusted under 35 U.S.C. 154(b) by 667 days.

(21) Appl. No.: 16/015,283

(22) Filed: Jun. 22, 2018

(65) Prior Publication Data

US 2019/0389589 A1 Dec. 26, 2019

(51) Int. Cl.
*B64D 15/12* (2006.01)
*H01L 51/42* (2006.01)
*H01L 51/00* (2006.01)

(52) U.S. Cl.
CPC ............ *B64D 15/12* (2013.01); *H01L 51/424* (2013.01); *B64D 2211/00* (2013.01); *H01L 51/0048* (2013.01)

(58) Field of Classification Search
CPC ... B64D 15/12; B64D 2211/00; H01L 51/424; H01L 51/0048
See application file for complete search history.

(56) References Cited

U.S. PATENT DOCUMENTS

| | | | |
|---|---|---|---|
| 5,746,580 A | 5/1998 | Parker et al. | |
| 5,925,275 A | 7/1999 | Lawson et al. | |
| 6,237,861 B1 | 5/2001 | Northrop et al. | |
| 8,366,047 B2 | 2/2013 | Euvino, Jr. et al. | |
| 8,931,740 B2 | 1/2015 | Nordin et al. | |
| 9,068,283 B2* | 6/2015 | Biris ........................ | H01B 1/04 |
| 9,511,871 B2* | 12/2016 | Steinwandel ............ | H05B 3/18 |
| 2004/0065092 A1 | 4/2004 | Wadia et al. | |
| 2006/0032983 A1 | 2/2006 | Brand et al. | |
| 2011/0167781 A1 | 7/2011 | Maheshwari | |
| 2011/0240621 A1* | 10/2011 | Kessler ................... | G01N 25/00 |
| | | | 219/200 |
| 2014/0000754 A1 | 1/2014 | Wallen | |
| 2014/0070054 A1 | 3/2014 | Burton et al. | |

FOREIGN PATENT DOCUMENTS

| | | |
|---|---|---|
| KR | 1020180020387 A | 2/2018 |
| WO | 2011094347 A2 | 8/2011 |

* cited by examiner

*Primary Examiner* — Justin M Benedik
(74) *Attorney, Agent, or Firm* — Dinsmore & Shohl LLP

(57) ABSTRACT

An aircraft can include an anti-icing system. The anti-icing system can include an array of carbon nanotubes thermally coupled to at least a first exposed surface of the aircraft. The anti-icing system can also include an array of solar cells carried by the aircraft and electrically coupled to the array of carbon nanotubes.

22 Claims, 7 Drawing Sheets

ANTI-ICING SYSTEM FOR AN AIRCRAFT

BACKGROUND

The formation of ice on aircraft structures, such as engine inlets, wings, control surfaces, propellers, booster inlet vanes, inlet frames, etc., can a problem for contemporary aircraft. Ice adds weight, increases drag, and impairs the aerodynamic contour of airfoils, control surfaces and inlets, all of which reduce performance and increase fuel consumption. In addition, ice that forms on aircraft structures can become dislodged, increasing risk to other aircraft parts and engine components. Contemporary aircraft can include de-icing or anti-icing detection systems that utilize heat sources or heat generating elements to provide heat to the aircraft structure to melt or prevent the formation of ice.

BRIEF DESCRIPTION

In one aspect, the disclosure relates to an anti-icing system for an aircraft including an array of carbon nanotubes thermally coupled to at least a first exposed surface of the aircraft, and an array of solar cells carried by the aircraft and electrically coupled to the array of carbon nanotubes.

In another aspect, the disclosure relates to an aircraft, including at least one aircraft component and an anti-icing system for an aircraft. The anti-icing system includes an array of carbon nanotubes thermally coupled to at least a first exposed surface of the aircraft, and an array of solar cells carried by the aircraft and electrically coupled to the array of carbon nanotubes.

In yet another aspect, the disclosure relates to a method of preventing ice formation on a surface of an aircraft. The method includes supplying electrical power from an array of solar cells to an array of carbon nanotubes coupled to a first exposed aircraft surface, and transferring heat from the array of carbon nanotubes to the first exposed aircraft surface.

DETAILED DESCRIPTION

Figure 1:
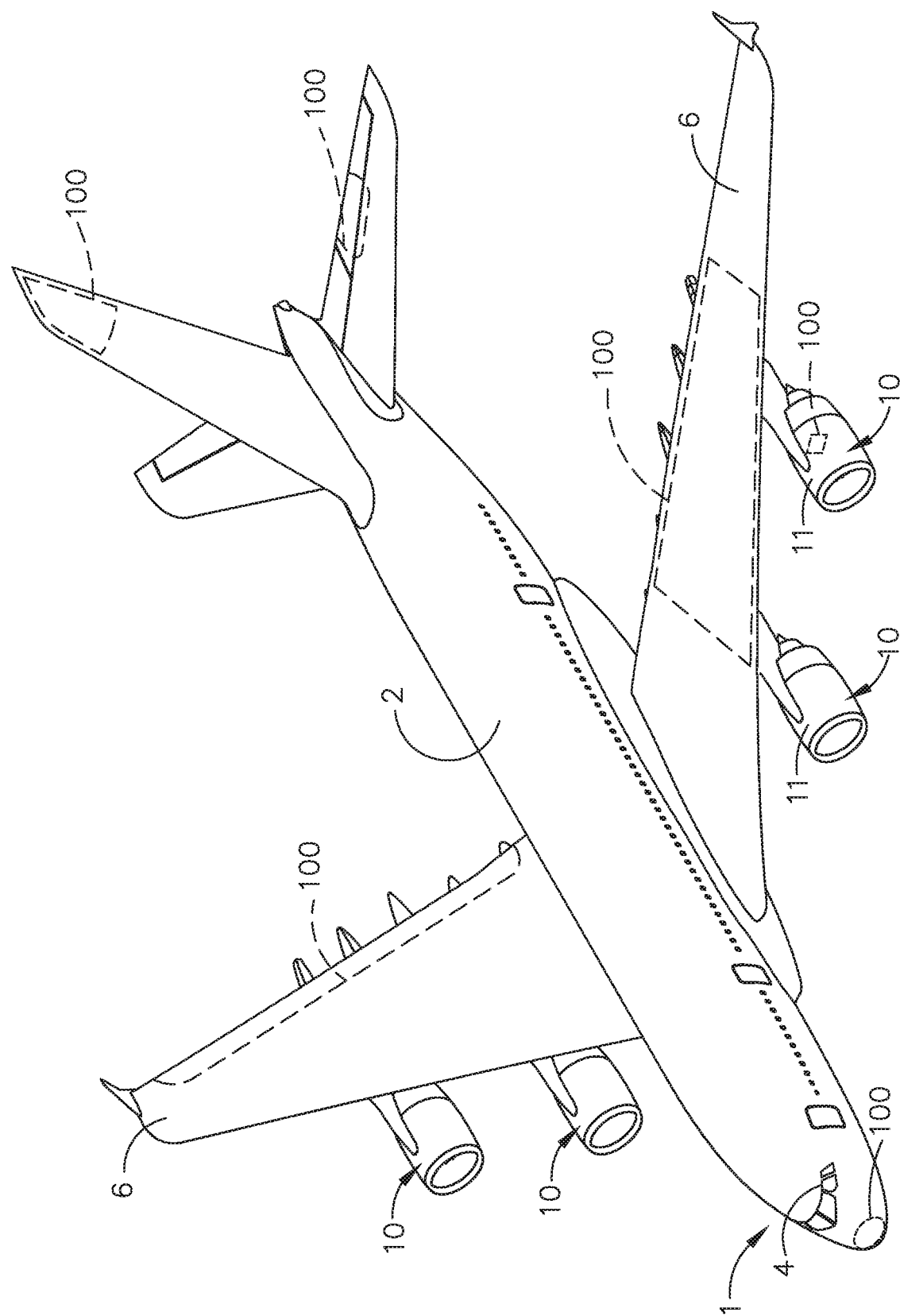
FIG. 1 is a perspective view of an aircraft having an anti-icing system in accordance with various aspects described herein.

The described embodiments of the present disclosure are directed to an anti-icing structure for a turbine engine. The anti-icing structure can include carbon nanotubes, which are a cylindrically-structured arrangement of carbon atoms that can be formed in a variety of ways including single-wall, double-wall, or multiple-walls. Such carbon nanotubes can have very high tensile strengths (in one example, up to 60 GPa), high thermal conductivities in a direction along the tube (in one example, up to 3500 W/m·K), and electrical conductivities similar to metals or semiconductors, depending on the specific arrangement of carbon atoms in the nanotube. When supplied with an electric current, carbon nanotubes can dissipate heat to surrounding structures.

For purposes of illustration, the present disclosure will be described with respect to an aircraft having a turbine engine. Furthermore, aspects of the present disclosure can be applicable to aircraft during flight or non-flight operations. It will be understood, however, that the disclosure is not so limited and may have general applicability in non-aircraft applications, such as other mobile applications and non-mobile industrial, commercial, and residential applications.

As used herein, the term "forward" or "upstream" refers to moving in a direction toward the engine inlet, or a component being relatively closer to the engine inlet as compared to another component. The term "aft" or "downstream" used in conjunction with "forward" or "upstream" refers to a direction toward the rear or outlet of the engine or being relatively closer to the engine outlet as compared to another component.

As used herein, "a set" can include any number of the respectively described elements, including only one element. Additionally, the terms "radial" or "radially" as used herein refer to a dimension extending between a center longitudinal axis of the engine and an outer engine circumference.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of the disclosure. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 illustrates an aircraft 1 that includes a fuselage 2, a cockpit 4 positioned in the fuselage 2, and wing assemblies 6 extending outward from the fuselage 2. The aircraft 1 can also include multiple engines, including turbine engines 10, which by way of non-limiting example, can be turbojet engines, turbofan engines, or turboprop engines. While a commercial aircraft 1 has been illustrated, it is contemplated that aspects of the disclosure described herein can be used in any type of aircraft. Further, while two turbine engines 10 have been illustrated on each of the wing assemblies 6, it will be understood that any number of turbine engines 10 including a single turbine engine 10 on the wing assemblies 6, or even a single turbine engine 10 mounted in the fuselage 2 can be included.

The aircraft 1 can include an anti-icing system 100 on at least one aircraft component, schematically illustrated as being positioned on a wing assembly 6 and a nacelle 11 of a turbine engine 10. As used herein, "anti-icing" will refer to removing ice that has accumulated on an aircraft component, or to the prevention of ice accumulation when environmental conditions are favorable for ice formation. In addition, it will be understood that the anti-icing system 100 can be positioned anywhere on the aircraft 1, including any desired portion of the fuselage 2.

Figure 2:
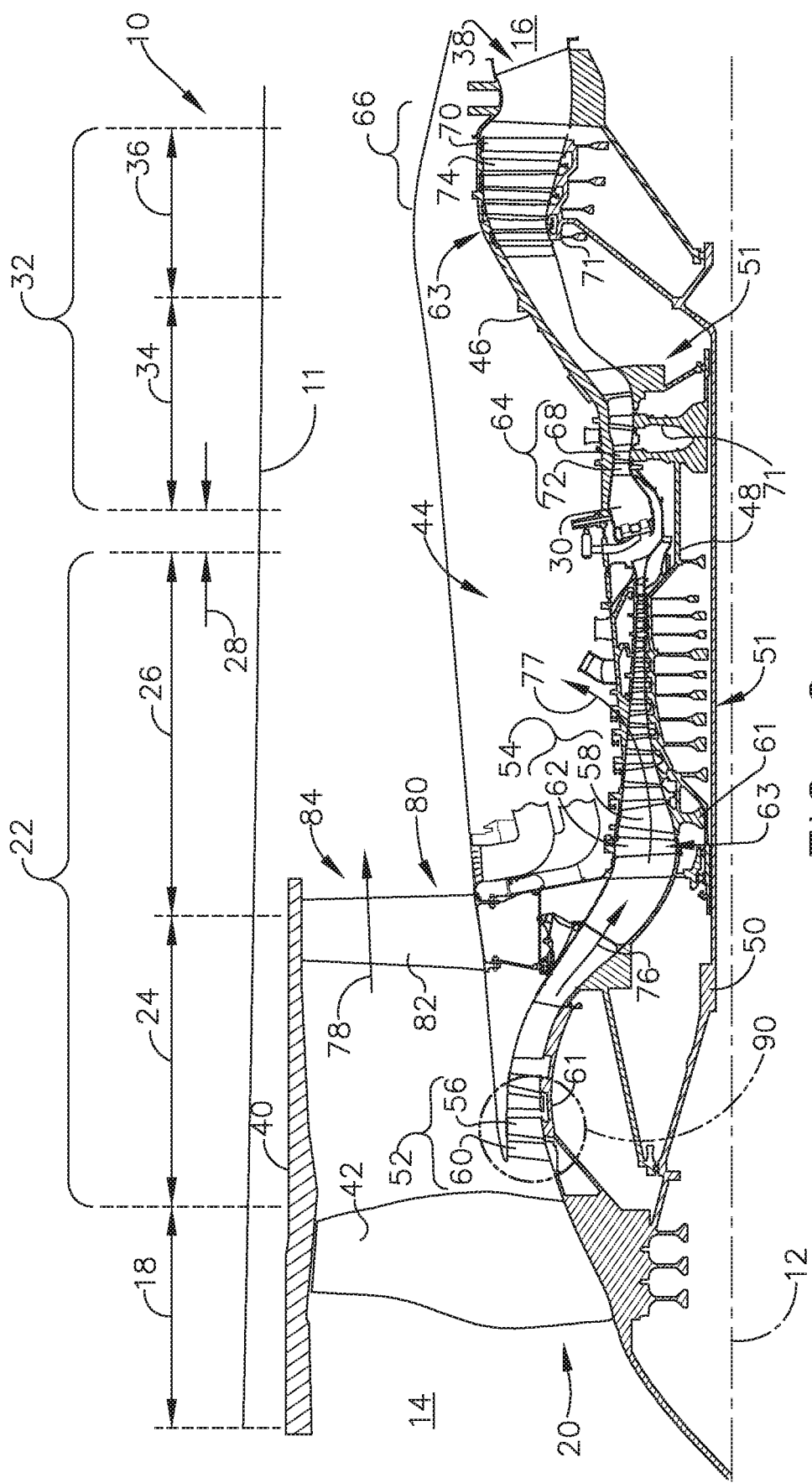
FIG. 2 is a schematic cross-sectional diagram of a turbine engine for the aircraft of FIG. 1 with the anti-icing system.

FIG. 2 is a schematic cross-sectional diagram of an exemplary gas turbine engine 10 which can be utilized in the aircraft 1. The engine 10 is housed within the nacelle 11 and has a generally longitudinally extending axis or centerline 12 extending forward 14 to aft 16. The engine 10 includes, in downstream serial flow relationship, a fan section 18 including a fan 20, a compressor section 22 including a booster or low pressure (LP) compressor 24 and a high pressure (HP) compressor 26, a combustion section 28 including a combustor 30, a turbine section 32 including a HP turbine 34, and a LP turbine 36, and an exhaust section 38.

The fan section 18 includes a fan casing 40 surrounding the fan 20. The fan 20 includes a plurality of fan blades 42 disposed radially about the centerline 12. The HP compressor 26, the combustor 30, and the HP turbine 34 form a core 44 of the engine 10, which generates combustion gases. The core 44 is surrounded by core casing 46, which can be coupled with the fan casing 40.

A HP shaft or spool 48 disposed coaxially about the centerline 12 of the engine 10 drivingly connects the HP turbine 34 to the HP compressor 26. A LP shaft or spool 50, which is disposed coaxially about the centerline 12 of the engine 10 within the larger diameter annular HP spool 48, drivingly connects the LP turbine 36 to the LP compressor 24 and fan 20. The spools 48, 50 are rotatable about the engine centerline and couple to a plurality of rotatable elements, which can collectively define a rotor 51.

The LP compressor 24 and the HP compressor 26 respectively include a plurality of compressor stages 52, 54, in which a set of compressor blades 56, 58 rotate relative to a corresponding set of static compressor vanes 60, 62 to compress or pressurize the stream of fluid passing through the stage. In a single compressor stage 52, 54, multiple compressor blades 56, 58 can be provided in a ring and can extend radially outwardly relative to the centerline 12, from a blade platform to a blade tip, while the corresponding static compressor vanes 60, 62 are positioned upstream of and adjacent to the rotating blades 56, 58. It is noted that the number of blades, vanes, and compressor stages shown in FIG. 1 were selected for illustrative purposes only, and that other numbers are possible.

The blades 56, 58 for a stage of the compressor can be mounted to (or integral to) a disk 61, which is mounted to the corresponding one of the HP and LP spools 48, 50. The vanes 60, 62 for a stage of the compressor can be mounted to the core casing 46 in a circumferential arrangement.

The HP turbine 34 and the LP turbine 36 respectively include a plurality of turbine stages 64, 66, in which a set of turbine blades 68, 70 are rotated relative to a corresponding set of static turbine vanes 72, 74 (also called a nozzle) to extract energy from the stream of fluid passing through the stage. In a single turbine stage 64, 66, multiple turbine blades 68, 70 can be provided in a ring and can extend radially outwardly relative to the centerline 12 while the corresponding static turbine vanes 72, 74 are positioned upstream of and adjacent to the rotating blades 68, 70. It is noted that the number of blades, vanes, and turbine stages shown in FIG. 1 were selected for illustrative purposes only, and that other numbers are possible.

The blades 68, 70 for a stage of the turbine can be mounted to a disk 71, which is mounted to the corresponding one of the HP and LP spools 48, 50. The vanes 72, 74 for a stage of the compressor can be mounted to the core casing 46 in a circumferential arrangement.

Complementary to the rotor portion, the stationary portions of the engine 10, such as the static vanes 60, 62, 72, 74 among the compressor and turbine section 22, 32 are also referred to individually or collectively as a stator 63. As such, the stator 63 can refer to the combination of non-rotating elements throughout the engine 10.

In operation, the airflow exiting the fan section 18 is split such that a portion of the airflow is channeled into the LP compressor 24, which then supplies pressurized air 76 to the HP compressor 26, which further pressurizes the air. The pressurized air 76 from the HP compressor 26 is mixed with fuel in the combustor 30 and ignited, thereby generating combustion gases. Some work is extracted from these gases by the HP turbine 34, which drives the HP compressor 26. The combustion gases are discharged into the LP turbine 36, which extracts additional work to drive the LP compressor 24, and the exhaust gas is ultimately discharged from the engine 10 via the exhaust section 38. The driving of the LP turbine 36 drives the LP spool 50 to rotate the fan 20 and the LP compressor 24.

A portion of the pressurized airflow 76 can be drawn from the compressor section 22 as bleed air 77. The bleed air 77 can be drawn from the pressurized airflow 76 and provided to engine components requiring cooling. The temperature of pressurized airflow 76 entering the combustor 30 is significantly increased. As such, cooling provided by the bleed air 77 is necessary for operating of such engine components in the heightened temperature environments.

A remaining portion of the airflow 78 bypasses the LP compressor 24 and engine core 44 and exits the engine assembly 10 through a stationary vane row, and more particularly an outlet guide vane assembly 80, comprising a plurality of airfoil guide vanes 82, at the fan exhaust side 84. More specifically, a circumferential row of radially extending airfoil guide vanes 82 are utilized adjacent the fan section 18 to exert some directional control of the airflow 78.

Figure 3:
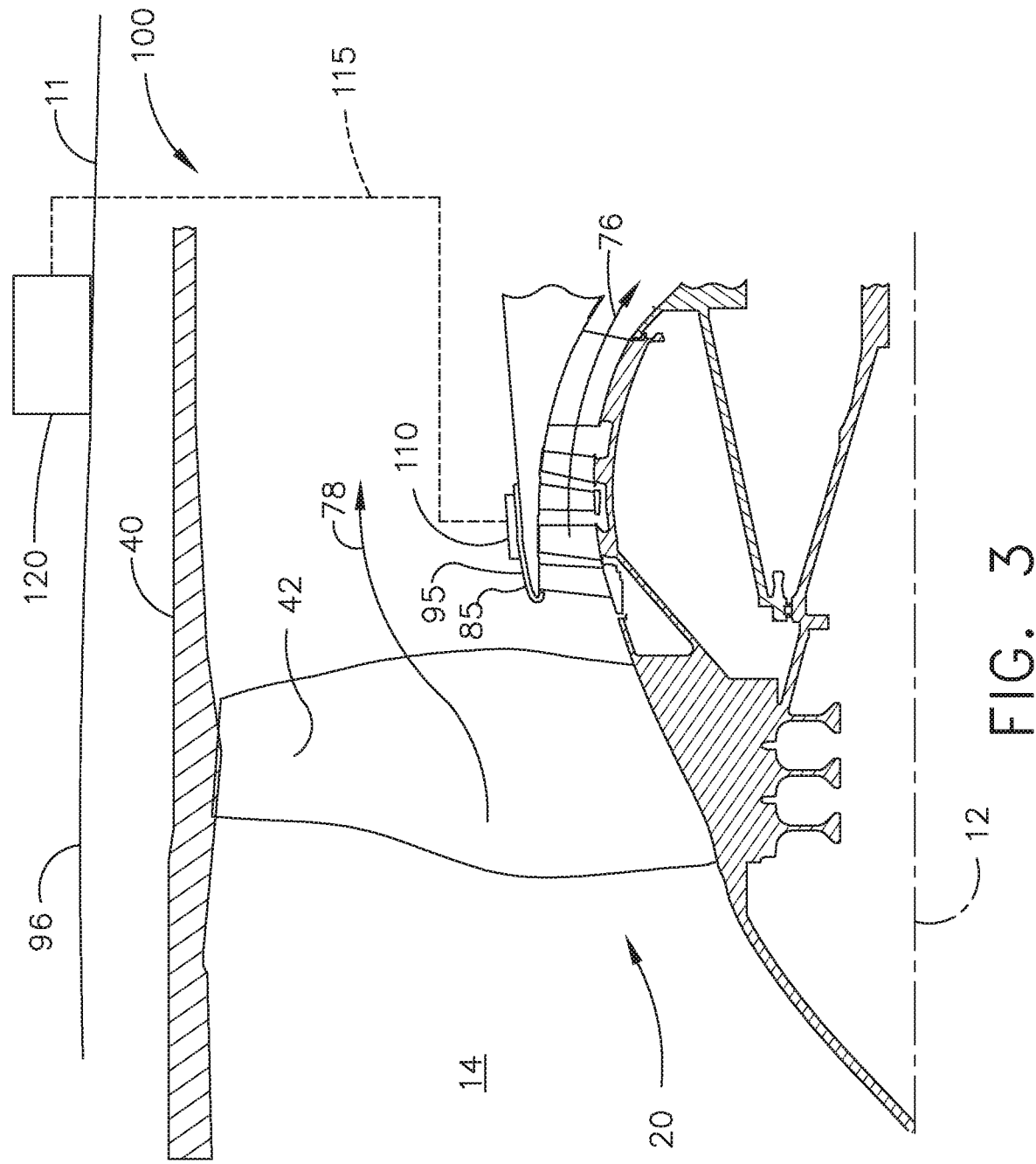
FIG. 3 is a schematic cross-sectional view of a portion of the turbine engine of FIG. 2 including the anti-icing system with an anti-icing structure and a power supply structure according to various aspects described herein.

A portion 90 of the compressor 22 is illustrated in FIG. 3, where the exemplary anti-icing system 100 (FIG. 1) is shown in further detail with an exposed surface of the aircraft 1. As used herein, an "exposed surface" or "exposed aircraft surface" will refer to a surface exposed directly or indirectly to accreted ice, or exposed to external airflows or water flows such that ice can accrete on the surface of the aircraft. One exemplary aircraft component with an exposed surface that can be susceptible to ice formation is illustrated as a splitter nose 85. The splitter nose 85 forms the leading edge to the inlet of the LP compressor 24 and splits the entering air into the bypass airflow 78, which flows over the engine core, and the pressurized airflow 76, which flows through the engine core. It is contemplated that the splitter nose 85 can be formed of a composite material, including carbon-filled epoxy. Alternately the splitter nose 85 can be metallic.

The anti-icing system 100 can include an anti-icing structure 110 coupled to the splitter nose 85, as well as a power supply structure 120 coupled to a second aircraft component such as the nacelle 11 in a non-limiting example. The anti-icing structure 110 and the power supply structure 120 can be electrically or thermally coupled by a conductor 115. Such a conductor 115 can include carbon nanotubes, such as carbon nanotube strands or fibers, or can also include wiring, such as aluminum or copper wiring.

The anti-icing structure 110 is schematically illustrated as being coupled to at least a first exposed surface 95, such as on a first aircraft component illustrated as the splitter nose 85. It is also contemplated that the anti-icing structure 110 can be at least partially embedded within the first exposed surface 95 to optimize airflow streamlines over the splitter nose surface and the anti-icing structure 110.

The power supply structure 120 is schematically illustrated as being carried by the aircraft. More specifically, the power supply structure 120 can be coupled to a second exposed surface 96 of the aircraft 10, such as on a second aircraft component illustrated as the nacelle 11. It will be understood that the relative size and position of the power supply structure 120 can vary. In addition, it should be understood that the power supply structure 120 can be adjoined with the second exposed surface 96 or at least partially embedded within the second exposed surface 96, such as to optimize airflow streamlines over the power supply structure 120.

The example of FIG. 3 shows that the power supply structure 120 can be positioned remotely from the anti-icing structure 110. It is also contemplated that the power supply structure 120 can be positioned adjacent the anti-icing structure 110. In addition, the anti-icing structure 110 and the power supply structure 120 can be positioned on the same exposed surface or on adjacent exposed surfaces of the same aircraft component. Other non-limiting examples of aircraft components or exposed surfaces 95, 96 thereof include an engine inlet, the booster 24, the outer fan case 40, or the wing 6 (FIG. 1).

Figure 4:
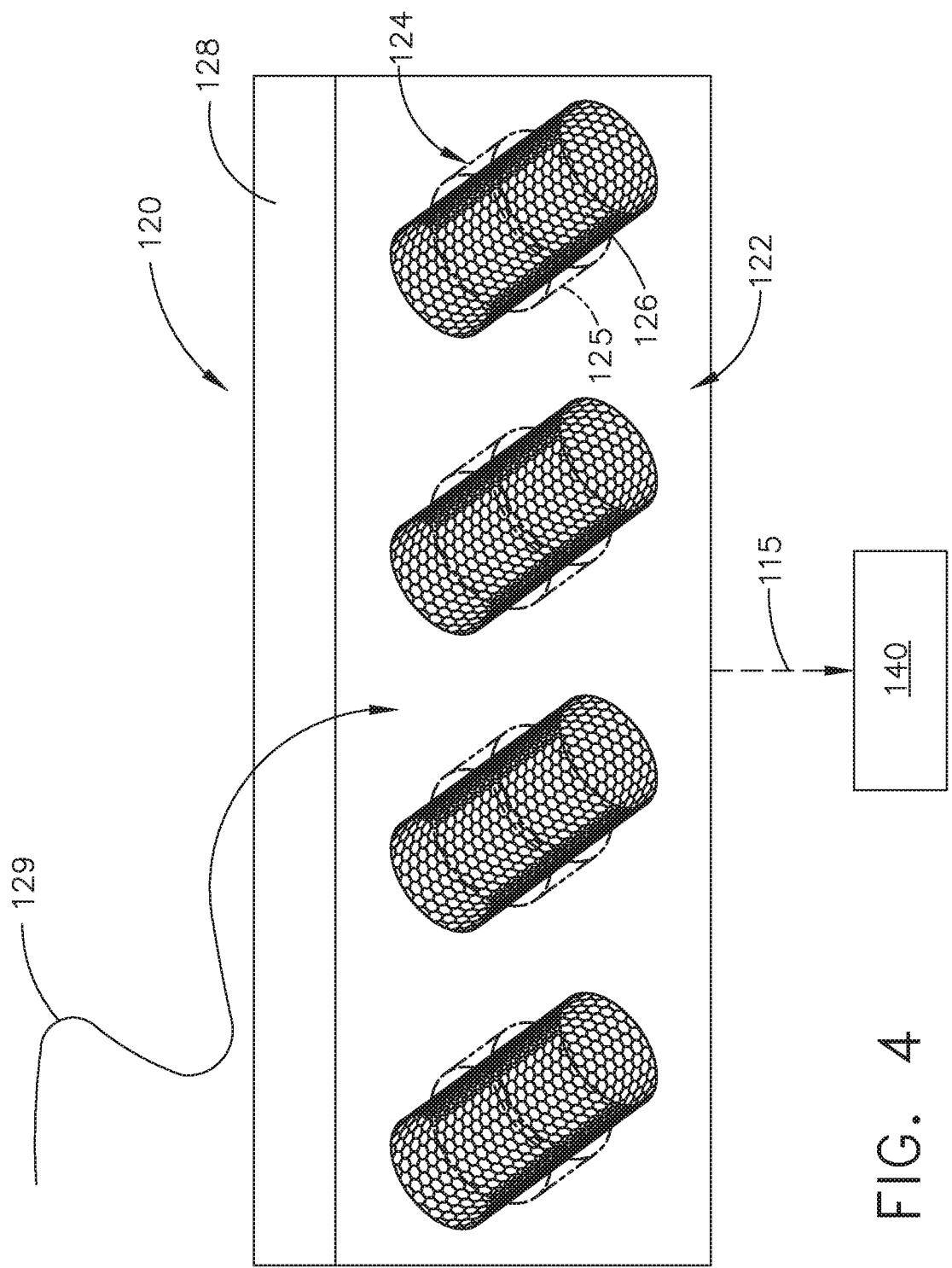
FIG. 4 is a schematic view of the power supply structure of FIG. 3.

Referring now to FIG. 4, the power supply structure 120 can further include an array 122 of solar cells 124. The solar cells 124 can have photovoltaic properties such that incident electromagnetic radiation, such as visible light, can be converted within the solar cells 124 to electric power. It is further contemplated that the solar cells 124 can be in the form of conducting polymers 125 coupled with carbon nanotubes 126 as shown. In the illustrated example, the carbon nanotubes 126 are embedded within conducting polymer solar cells 124 to form nanofilaments. In another example, the solar cells 124 can be embedded within carbon nanotubes 126. Such coupling can provide for increased power conversion efficiency or increased wavelength range capable of conversion into electrical power compared to traditional solar cells. It is also contemplated that the solar cells can be an array of photovoltaic cells that are spaced from and/or interspersed with the array of carbon nanotubes.

In addition, a transmissive layer 128 can optionally be coupled to and overlie the array 122 of solar cells. As used herein, "transmissive" will refer to a material property of being transparent to a wide range of electromagnetic wavelengths, including radio, microwave, infrared, optical, and ultraviolet, in non-limiting examples. The transmissive layer 128 can be formed of a protective material such as glass or polymer. In a non-limiting example, the transmissive layer 128 can include multiple layers of transmissive materials, including combinations of transmissive materials. In this manner, incident electromagnetic radiation (indicated by the arrow 129) can be transmitted through the transmissive layer 128 to reach the array 122 of solar cells, and the transmissive layer 128 can provide protection for the power supply structure 120 during operation of the aircraft 1.

Figure 5:
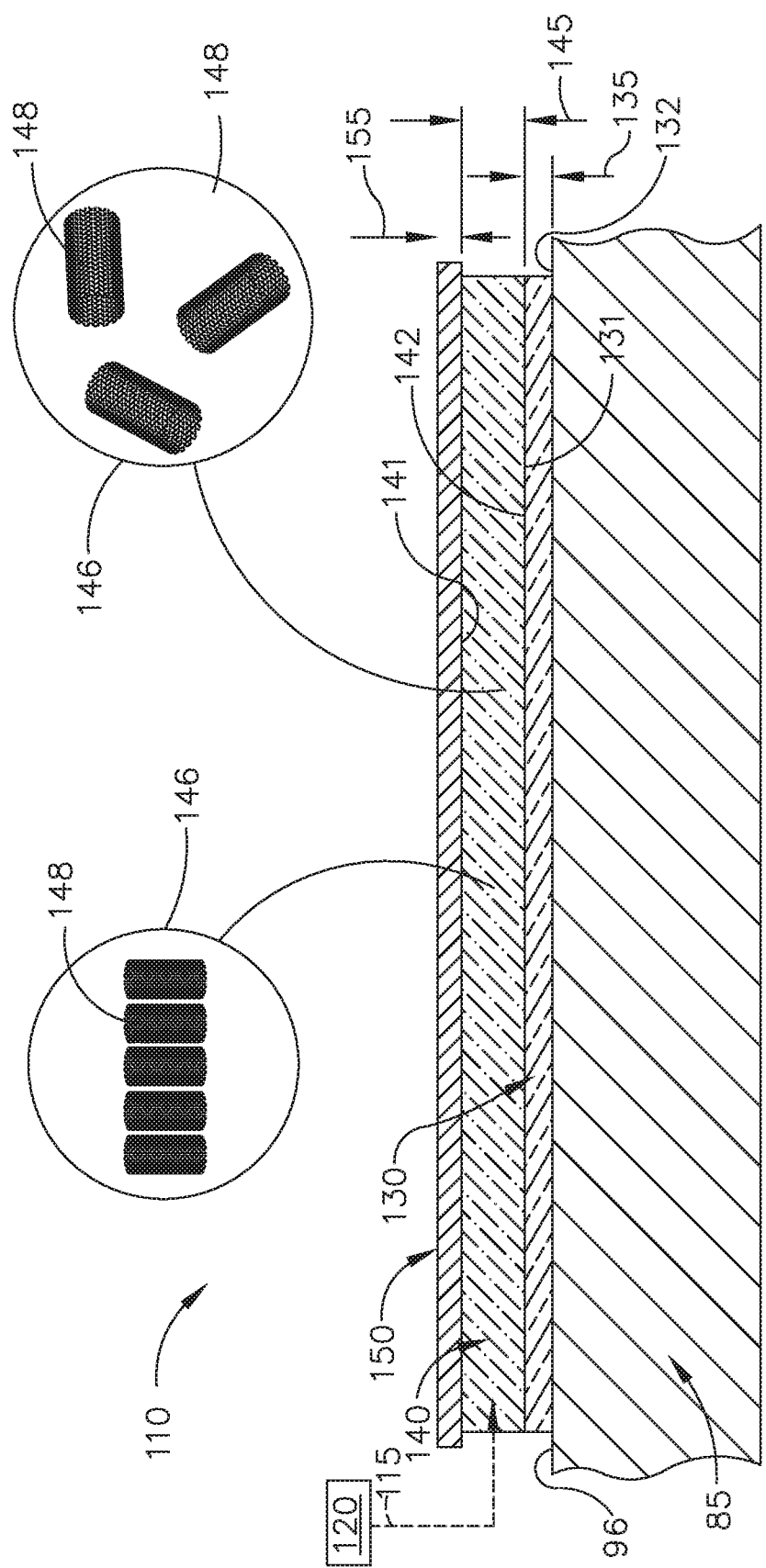
FIG. 5 is a schematic cross-sectional view of the anti-icing structure of FIG. 3.

Turning to FIG. 5, the anti-icing structure 110 is illustrated in further detail. It is contemplated that the anti-icing structure 110 can include an insulation layer 130, a heat-generating layer 140, and an erosion protection layer 150.

The insulation layer 130 can have a first side 131 and opposing second side 132, the second side 132 being coupled to the splitter nose 85 (FIG. 3). An insulation layer thickness 135 can be defined between the first and second sides 131, 132 as shown. In a non-limiting example, the insulation layer thickness can be between 200 and 1400 µm. Further, the insulation layer can be made from a variety of electrically or thermally insulating materials such as fiberglass, polymer/plastics, or composite materials, in non-limiting examples.

The heat-generating layer 140 can have a first side 141 and opposing second side 142, where the second side 142 of the heat-generating layer 140 is coupled to the first side 131 of the insulation layer 130 as shown. A heating layer thickness 145 can be defined between the first and second sides 141, 142 as shown, such as between 200 and 1400 µm in a non-limiting example.

It is contemplated that a carbon nanotube array 146 can be disposed within the heat-generating layer 140. Carbon nanotubes 148 within the array 146 can have a variety of orientations; while illustrated as being oriented randomly within the array 146, it is contemplated that that the carbon nanotubes 148 can be aligned in any desired direction. In this manner, the array 146 of carbon nanotubes can be thermally coupled to the splitter nose 85. In addition, the conductor 115 can be electrically coupled to the carbon nanotube array 146, providing an electrical coupling between the array 146 and the power supply structure 120.

While not shown, it is further contemplated that the array 122 of solar cells can also be positioned within the heat-generating layer. In such a case, the solar cells 124 and carbon nanotubes 148 can be interspersed throughout the heat-generating layer. Alternately, the solar cells 124 can be grouped to form the array 122 in a first portion of the heat-generating layer, and the carbon nanotubes 148 can be grouped to form the array 146 in a second portion of the heat-generating layer. It can thus be appreciated that the anti-icing system 100 can have the array 122 of solar cells and the array 146 of carbon nanotubes coupled to the same exposed surface of an aircraft component.

The erosion protection layer 150 can be coupled to the heat-generating layer 140 within the anti-icing structure 110. The erosion protection layer 150 can be metallic and have a protection layer thickness 155 such as between 200 and 1400 µm in a non-limiting example. It is further contemplated that the protection layer thickness 155 can be the same size as the insulation layer thickness 135. In another example, the heating layer thickness 145 can be twice as large as one of the insulation layer thickness 135 or the protection layer thickness 155.

In operation, electromagnetic radiation (arrow 129 of FIG. 4) incident on the power supply structure 120 can travel through the transmissive layer 128 and encounter the array 122 of solar cells. The solar cell array 122 can convert such incident electromagnetic radiation into electrical power, and can supply the converted electrical power to the array 146 of carbon nanotubes within the heat-generating layer 140 (FIG. 5). The electrical power can be supplied via the conductor 115, such as copper wiring or carbon nanotube fibers. The array 146 of carbon nanotubes can generate heat due to the supplied electrical power, and the generated heat can conduct through the erosion protection layer 150 and melt any accumulated ice over the erosion protection layer 150 or the exposed surface 95. It can also be appreciated that the conducted heat can also prevent ice formation over the erosion protection layer 150 or the exposed surface 95.

Figure 6:
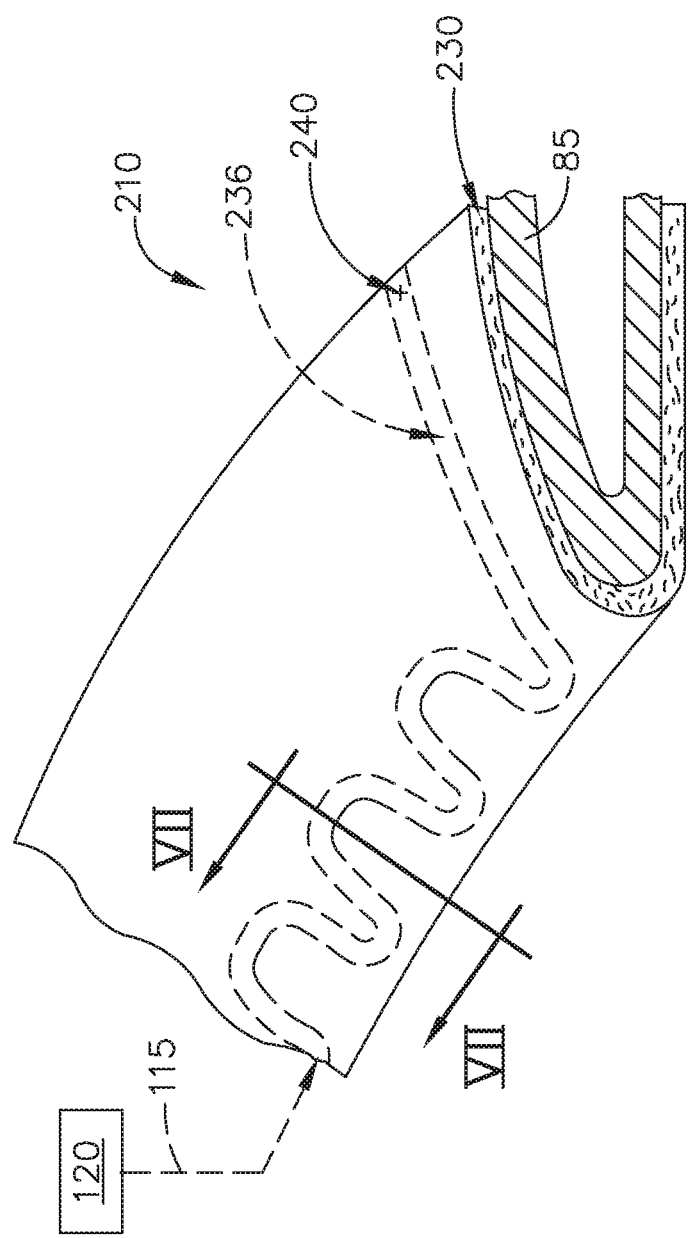
FIG. 6 is a schematic perspective view of another anti-icing structure that can be utilized in the anti-icing system of FIG. 1.

FIG. 6 illustrates another anti-icing structure 210 that can be utilized in the anti-icing system 100 of FIG. 1. The anti-icing structure 210 is similar to the anti-icing structure 110; therefore, like parts will be described with like numerals increased by 100, with it being understood that the description of the like parts of the anti-icing structure 110 applies to the anti-icing structure 210, except where noted.

The anti-icing structure 210 can include an insulation layer 230 and a heat-generating layer 240. One difference is that at least one channel 236 can be formed in the insulation layer 230, and the heat-generating layer 240 can be positioned within the channel 236. For example, at least a portion of the channel 236 can have a serpentine profile as shown. In other non-limiting examples, the channel 236 can have a rectangular, rounded, linear, or irregular geometric profile.

Figure 7:
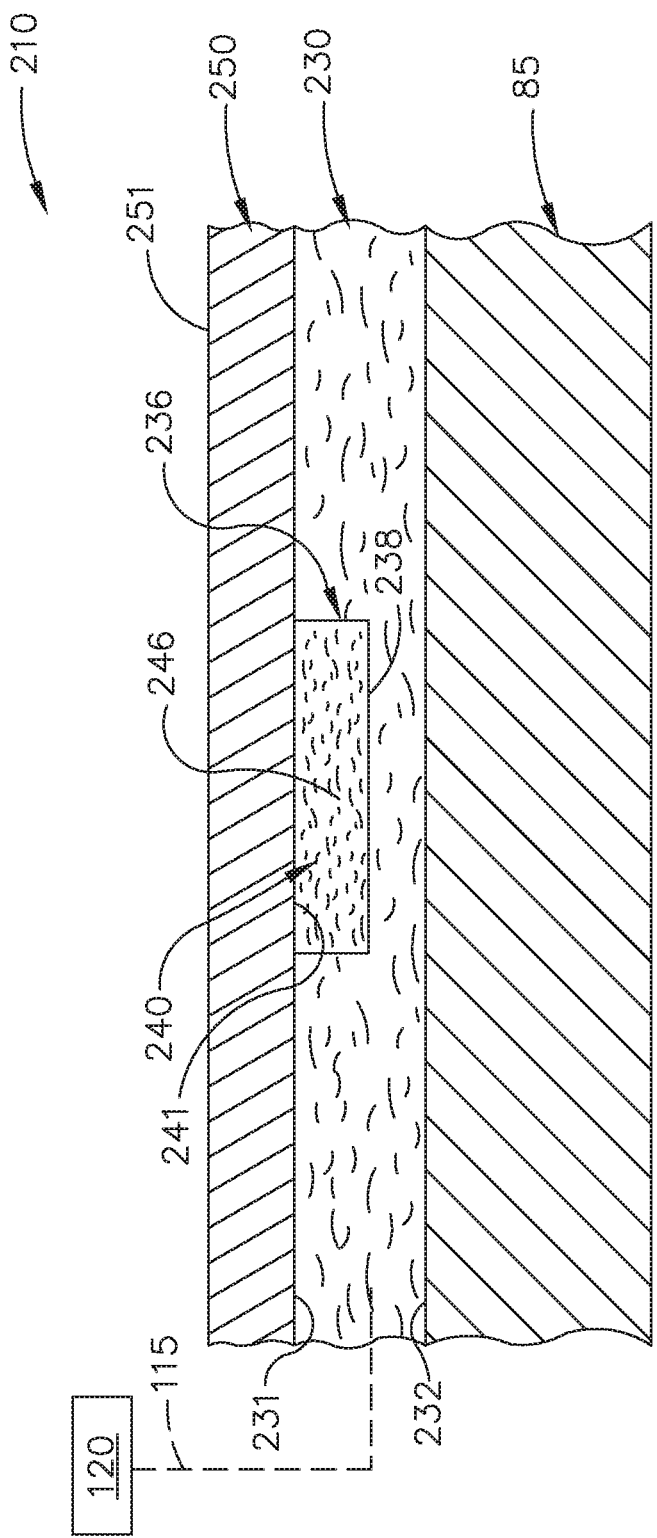
FIG. 7 is a schematic cross-sectional view of the anti-icing structure of FIG. 6 along line VII-VII.

Turning to FIG. 7, the channel 236 can further include an inner surface 238 spaced from a second side 232 of the insulation layer 230. An array 246 of carbon nanotubes can be disposed within the heat-generating layer 240, and the layer 240 can be coupled to the inner surface 238 of the channel 236 as shown. In addition, an erosion protection layer 250 can cover over the insulation layer 230 and heat-generating layer 240 within the channel 236 as shown.

In one example the heat-generating layer 240 can include a first side 241 that is flush or coplanar with a first side 231 of the insulation layer 230 as shown. It is also contemplated that the first side 241 of the heat-generating layer 240 can extend beyond the first side 231 of the insulating layer 230. In such a case, the erosion protection layer 250 can be of sufficient thickness to account for any extension of the heat-generating layer 240 beyond the insulating layer 230. The erosion protection layer 250 can thereby have a smooth outer surface 251.

A method of preventing ice formation on a surface of the aircraft 1 includes supplying electrical power from an array of solar cells, such as the array 124, to the array 146 of carbon nanotubes 148 coupled to an exposed aircraft surface, such as the exposed surface 95. Heat can be transferred from the array 146 of carbon nanotubes to the exposed surface 95. Optionally, the method can include supplying power via a carbon nanotube conductor 115 electrically coupled to the array 122 of solar cells and the array 146 of carbon nanotubes. Optionally, the method can include generating heat within a heat-generating layer, such as the heat-generating layer 140, 240, having an array of carbon nanotubes. Optionally, the supplying electrical power can include supplying electrical power to the heat-generating layer 140, 240 coupled to a second exposed aircraft surface 96 remote from the first exposed aircraft surface 95.

Aspects of the present disclosure provide for a variety of benefits. Traditional anti-icing solutions have included using heated bleed air from the engine to remove or prevent ice accumulation from aircraft components such as booster and engine inlet structures, which limits engine performance. In addition, complex air ducting structures have been utilized to direct such heated bleed air to aircraft components for anti-icing, which also adds weight to the engine. The use of carbon nanotubes in the heat-generating layer can reduce engine weight and complexity, as dedicated ducting systems are no longer needed. In one example a weight reduction of more than 50 pounds was achieved through use of the anti-icing system of the present disclosure. The heat-generating carbon nanotubes can also improve engine performance, as more air can remain within the engine for combustion instead of being pulled out as bleed air. Further, the use of carbon-nanotube-coupled solar cells for powering the heat-generating layer can also improve efficiency and reduce costs of operation, as the power systems onboard the aircraft can be utilized for other operations instead of ice prevention or removal. It can be appreciated that the coupling of carbon nanotubes with solar cells can increase the power conversion efficiency of the solar cells, providing more power to the heat-generating layer.

To the extent not already described, the different features and structures of the various embodiments can be used in combination, or in substitution with each other as desired. That one feature is not illustrated in all of the embodiments is not meant to be construed that it cannot be so illustrated, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An anti-icing system for an aircraft comprising:
an array of carbon nanotubes thermally coupled to at least a first exposed surface of the aircraft, wherein the first exposed surface is located on an engine inlet, a booster, a splitter nose, an outer fan case, or a nacelle;
an array of solar cells carried by the aircraft and electrically coupled to the array of carbon nanotubes; and
an insulation layer having opposing first and second sides, the second side being coupled to the first exposed surface of the aircraft.

2. The anti-icing system of claim 1 wherein the array of solar cells further comprises carbon nanotubes embedded within conducting polymers.

3. The anti-icing system of claim 1 wherein the array of solar cells is provided on a second exposed surface of the aircraft remote from the first exposed surface.

4. The anti-icing system of claim 1 further comprising a transmissive layer overlying the array of solar cells.

5. The anti-icing system of claim 1 further comprising a channel in the insulation layer, the channel having an inner surface spaced from the second side.

6. The anti-icing system of claim 5 wherein a heat-generating layer is positioned within the channel and coupled to the inner surface of the channel.

7. The anti-icing system of claim 6 wherein the array of carbon nanotubes is disposed within the heat-generating layer coupled to the inner surface of the channel.

8. The anti-icing system of claim 5 wherein at least a portion of the channel has a serpentine profile.

9. The anti-icing system of claim 1 wherein the array of carbon nanotubes is disposed within a heat-generating layer coupled to the insulation layer.

10. The anti-icing system of claim 9 further comprising an erosion protection layer coupled to the heat-generating layer.

11. The anti-icing system of claim 10 wherein the insulation layer comprises an insulation layer thickness, the heat-generating layer comprises a heating layer thickness, and the erosion protection layer comprises a protection layer thickness.

12. The anti-icing system of claim 11 wherein at least one of the insulation layer thickness, the heating layer thickness, and the protection layer thickness is between 200 and 1400 µm.

13. The anti-icing system of claim 11 wherein the heating layer thickness is at least twice as large as one of the insulation layer thickness or the protection layer thickness.

14. An aircraft, comprising:
   at least one an aircraft component; and
   an anti-icing system for an aircraft comprising:
      an array of carbon nanotubes thermally coupled to at least a first exposed surface of the at least one aircraft component, the at least one aircraft component comprising at least one of an engine inlet, a booster, a splitter nose, an outer fan case, and a nacelle;
      an array of solar cells carried by the aircraft and electrically coupled to the array of carbon nanotubes; and
      an insulation layer having opposing first and second sides, the second side being coupled to the first exposed surface of the aircraft.

15. The aircraft of claim 14 wherein the array of carbon nanotubes is thermally coupled to a first aircraft component and the array of solar cells is provided on a second aircraft component.

16. The aircraft of claim 14 wherein the at least one aircraft component comprises a carbon-filled epoxy composite material.

17. The aircraft of claim 14 wherein the array of solar cells further comprises carbon nanotubes embedded within conducting polymers.

18. A method of preventing ice formation on a surface of an aircraft, the method comprising:
   supplying electrical power from an array of solar cells to an array of carbon nanotubes coupled to a first exposed aircraft surface, wherein an insulation layer having opposing first and second sides is coupled to the first exposed aircraft surface and the first exposed aircraft surface is located on an engine inlet, a booster, a splitter nose, an outer fan case, or a nacelle; and
   transferring heat from the array of carbon nanotubes to the first exposed aircraft surface.

19. The method of claim 18 wherein the supplying electrical power further comprises supplying electrical power from an array of solar cells coupled with carbon nanotubes.

20. The method of claim 18 wherein the supplying electrical power further comprises supplying electrical power via carbon nanotubes electrically coupled to one of the array of solar cells or the array of carbon nanotubes coupled to the first exposed aircraft surface.

21. The method of claim 18 further comprising generating heat within a heat-generating layer having the array of carbon nanotubes.

22. The method of claim 21 wherein the supplying electrical power further comprises supplying electrical power to the heat-generating layer from the array of solar cells coupled to a second exposed aircraft surface remote from the first exposed aircraft surface.

* * * * *